United States Patent
Ning et al.

(10) Patent No.: US 12,224,253 B2
(45) Date of Patent: Feb. 11, 2025

(54) MAGNETIC INDUCTOR DEVICE AND METHOD

(71) Applicant: Intel Corporation, Santa Clara, CA (US)

(72) Inventors: Xin Ning, Tigard, OR (US); Brandon C. Marin, Gilbert, AZ (US); Kyu Oh Lee, Chandler, AZ (US); Siddharth K. Alur, Chandler, AZ (US); Numair Ahmed, Chandler, AZ (US); Brent Williams, Chandler, AZ (US); Mollie Stewart, Scottsdale, AZ (US); Nathan Ou, Chandler, AZ (US); Cary Kuliasha, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 660 days.

(21) Appl. No.: 17/480,064

(22) Filed: Sep. 20, 2021

(65) Prior Publication Data
US 2023/0092492 A1 Mar. 23, 2023

(51) Int. Cl.
| | |
|---|---|
| *H01L 23/64* | (2006.01) |
| *H01F 27/28* | (2006.01) |
| *H01L 21/48* | (2006.01) |
| *H01L 23/498* | (2006.01) |
| *H01L 49/02* | (2006.01) |

(52) U.S. Cl.
CPC ....... *H01L 23/645* (2013.01); *H01F 27/2804* (2013.01); *H01L 21/486* (2013.01); *H01L 23/49827* (2013.01); *H01L 23/49866* (2013.01); *H01L 28/10* (2013.01)

(58) Field of Classification Search
CPC ............ H01L 23/645; H01L 23/49827; H01L 23/49866; H01L 28/10; H01L 21/486; H01F 27/2804

See application file for complete search history.

(56) References Cited

U.S. PATENT DOCUMENTS

| | | | |
|---|---|---|---|
| 10,504,848 B1 * | 12/2019 | Parto | ................... H01L 21/4853 |
| 2014/0035892 A1 * | 2/2014 | Shenoy | ............... H01L 23/5389 |
| | | | 345/205 |
| 2018/0342467 A1 * | 11/2018 | Lim | ........................ H01L 28/40 |

(Continued)

*Primary Examiner* — Nathan W Ha
(74) *Attorney, Agent, or Firm* — Alliance IP, LLC

(57) ABSTRACT

Transmission pathways in substrates, and associated methods are shown. Example transmission pathways include a semiconductor substrate with a core, a dielectric layer fixed on the core, at least one first electrical transmission pathway extending through at least one of the dielectric layer and the core. The first pathway includes a magnetic material disposed within the at least the core of the at least one first electrical transmission pathway, at least one second electrical transmission pathway extending through the magnetic material, a nickel layer disposed on inner circumferential surface of the magnetic material at least within the second electrical transmission pathway, a copper layer disposed on at least the nickel layer within the second electrical transmission pathway. The dielectric spacer or the nickel layer separates the copper layer from the magnetic material. At least one third pathway extends through at least one of the dielectric layer and the core separate from the at least one electrical transmission pathway.

27 Claims, 6 Drawing Sheets

(56) References Cited

U.S. PATENT DOCUMENTS

| | | | | |
|---|---|---|---|---|
| 2019/0311980 A1* | 10/2019 | Eid | .......................... | H01G 4/33 |
| 2020/0035617 A1* | 1/2020 | Stewart | ............... | H01L 23/3171 |
| 2020/0273839 A1* | 8/2020 | Elsherbini | ............... | H01L 24/17 |
| 2021/0067132 A1* | 3/2021 | Kamgaing | ............ | H01L 25/165 |
| 2021/0296265 A1* | 9/2021 | Fuji | ..................... | H01F 27/2885 |
| 2021/0375525 A1* | 12/2021 | Kao | ........................ | H01L 28/10 |
| 2022/0013480 A1* | 1/2022 | Chen | .................. | H01L 23/5223 |
| 2022/0077081 A1* | 3/2022 | Kurita | ................. | H01F 27/2804 |
| 2022/0189677 A1* | 6/2022 | Blay | ........................ | H03H 7/42 |
| 2022/0328237 A1* | 10/2022 | Li | ...................... | H01F 17/0013 |

* cited by examiner

MAGNETIC INDUCTOR DEVICE AND METHOD

TECHNICAL FIELD

This document pertains generally, but not by way of limitation, to integrated circuit structures having layers which prevent corrosion.

BACKGROUND

Voltage regulators are an integral part of power delivery systems. Voltage regulators are off-chip devices (i.e., on mother boards to enable delivery to other components of the system) or on-chip devices (i.e., as a component to a system-on-a-chip). To achieve a higher level of efficiency, on-chip integrated voltage regulators have become standard in the chip manufacturing and development industry. As such, integrated voltage regulators are one of the building blocks in power delivery networks.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Coaxial magnetic inductor loops (Coax MIL) are one component in forming more efficient high integrated voltage regulators. Coax MIL are a key building block to enable high integrated voltage regulation efficiency. Coax MIL have been successfully implemented for power delivery products with fully integrated voltage regulator efficiency. Newer magneto-dielectric materials with magnetic fillers, such as iron-alloy, are used to enable a higher inductance and a lower loss. As such, in an example. Coax MIL utilizes a magneto-dielectric material to enable a higher inductance and a lower loss. For example, when forming or manufacturing a Coax MIL a passivate, such as an electroless nickel passivate, is deposited on a magnetic filler, such as an iron-alloy filler, to improve the wet chemical resistance. This example process is performed to enable electroless copper subtractive etching or copper etching.

To minimize corrosion, such as galvanic corrosion, between the magnetic core and the copper layer adsorption of a layer of copper anti-tarnish material or a nickel plating inhibitor, such as a nickel passivation layer, are disposed (formed, placed, deposited) on the surface of copper foils. However, even with the inhibitors, the magnetic materials are still in close contact with the copper.

When the magnetic material is proximate to the copper layer, it is possible, and likely, the electrons from the magnetic material will react with the copper layer and cause galvanic corrosion. One example process used to minimize galvanic corrosion is to have multiple passes of plating a nickel layer; however, in an example, these multiple passes leads to high costs. Even with multiple passes, some of the magnetic material is, for example, in contact with the copper layer. It is challenging to control the nickel layer on the magnetic filler.

In an example, magneto-dielectric materials with iron alloy fillers are used to enable higher inductance at lower losses. However, it is challenging to control materials having passivation qualities, for example electroless nickel (eless nickel), and the deposition of such passivation materials on the surface of a magnetic material. The example process flows described herein are examples of methods for forming substrates having surfaces which prevent galvanic corrosion.

Figure 1:
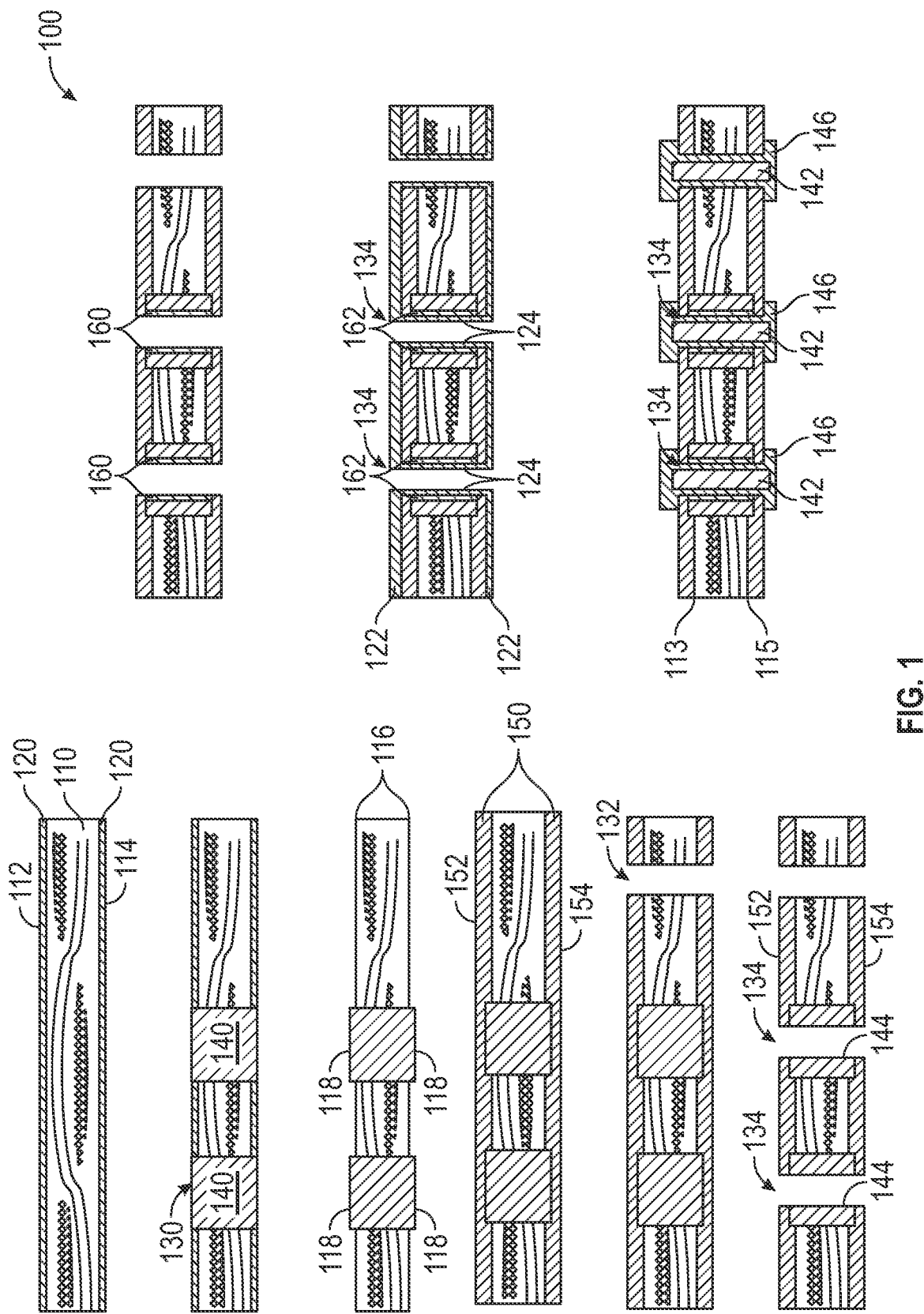
FIG. 1 is an illustration of a process flow for forming a substrate for a coaxial magnetic inductor loop.

As illustrated in FIG. 1, a substrate 100 includes a core 110. In an example, the core 110 is a resin material. The resin core 110, in one example, is a polymer resin. In an example, cores made from other materials suitable for the specified purpose of the substrate 100 are also contemplated. Hereinafter, "resin core" will refer to cores made from a resin material and cores made from another material. In an example, the resin core 110 has glass or fiberglass dispersed throughout. The thickness of the resin core 110 depends on the specified final use.

The resin core 110 has a copper layer 120 disposed (formed, placed, coupled) on at least one of the exposed surfaces 116 of the resin core 110. In an example, the copper layer 120 is a copper foil. The copper layer is referred to generically throughout for any conductive material specified for the purpose of the substrate 100.

At least one first through hole 130 is drilled or formed through the substrate 100. Hereinafter, "through hole" will refer to a pathway through the associated materials. In an example, multiple first through holes 130 (first through hole will refer to both multiple and singular through holes) are formed extending through the substrate 100. The first through hole 130 is formed extending from an upper surface 112 of the copper layer 120, through the resin core 110 and through the lower surface 114 of the copper layer 120. In an example, the first through hole 130 is formed perpendicular, near perpendicular or askew to the longitudinal direction of the resin core 110. The first through hole 130 is formed in a specified diameter according to the use of the substrate 100.

The first through hole 130, in an example, is filled (substantially filled, partially filled or completely filled) with a magnetic material 140. The magnetic material 140 is any known material with magnetic properties. In an example, the magnetic material 140 is iron, iron alloys, nickel-zinc alloy, permalloy, silicon steels, ferrites, or amorphous alloys. The magnetic material 140, in another example, is a plug within the first through hole 130 where the magnetic material 140 fills (completely fills or partially fills) the through hole 130 from the upper surface 112 of the copper layer 120 to the lower surface 114 of the copper layer 120.

After the magnetic material 140 fills (completely fills or partially fills) the through hole 130, the upper surface 112 of the copper layer 120 and lower surface 114 of the copper layer are etched, filed, ground or any similar process to make the upper surface 112 of the copper layer 120 and lower surface 114 of the copper layer 120 smooth (e.g. nearly or completely flat, even, level). In an example, both the copper layer 120 and the magnetic material 140 are ground, ground, filed or any similar process to make a smooth (e.g. nearly or completely flat, even, level) upper surface 112 and lower surface 114. In an example, the exposed surfaces of the magnetic material 140 within the through hole 130 are smooth (e.g. nearly or completely flat, even, level) surfaces with the copper layer 120. In an example, the magnetic material 140 extends, protrudes or is exposed out of the first through hole 130 a substantially equal distance outside of the first through hole 130 as the copper layer 120 is thick.

As illustrated in FIG. 1, after the magnetic material 140 is filled (completely filled or partially filled) within the first through hole 130, the copper layer 120 is etched, filed, ground or any similar process, from the surface of the resin core 110 at specified locations (e.g. select locations, the whole surface). The exposed surfaces 116 of the resin core, in some examples, may be ground, filed or any similar process or otherwise treated to form a smooth (e.g. nearly or completely flat, even, level) surface. In another example, no action is taken to the exposed surfaces 116 to smooth or otherwise treat the exposed surfaces 116. When the copper layer 120 is etched, filed, ground or any similar process, from the resin core 110, the magnetic material 140 is exposed outside of the resin core 110. In an example, the magnetic material 140 is exposed, protrudes, or extends outside of the first through hole 130 the same or similar distance as the copper layer 120 was thick. In another example, the magnetic material 140 is exposed, protrudes, or extends outside of the first through hole 130 a distance less than the copper layer 120 was thick.

A dielectric layer 150 is disposed (deposited, formed, placed, coupled) on at least one of the exposed surfaces 116. In an example, the dielectric layer 150 is a dielectric material such as a polymer, polymer resin, rubber, glass, inorganic nitride passivation, or metal oxide. In another example, the dielectric layer 150 is a build-up material which forms a layer on the exposed surfaces 116 and is non-reactive with the magnetic material 140. In another example, the dielectric layer 150 is a dielectric material such as Ajinomoto Build-Up Film (ABF). The dielectric layer 150 extends over the exposed surfaces 116 of the resin core 110 and the exposed surfaces 118 of the magnetic material 140. In an example, the dielectric layer 150 is a spacer between at least two materials layered above and below the dielectric layer. The dielectric layer 150 is a smooth (e.g. nearly or completely flat, even, level) upper surface 152 and lower surface 154 over the resin core 110 and the magnetic material 140. In an example, the dielectric layer 150 covers specified areas near and around the magnetic material 140.

At least one second through hole 132 (or pathway) extends through the dielectric layer 150 and the resin core 110. In an example, the second through hole 132 is a core through hole. The second through hole 132 extends from an upper surface 152 of the dielectric layer through resin core 110 and the lower surface 154 of the dielectric layer 150 in an area of the substrate 100 remote from the areas with the magnetic material 140. The second through hole 132 is formed perpendicular, near perpendicular or askew to the longitudinal direction of the resin core 110. In an example, the second through hole 132 is proximate to the area containing the magnetic material 140.

After the dielectric layer 150 covers the exposed surfaces 116 of the resin core 110 and the magnetic material 140, a third through hole 134 (or pathway) is formed within the magnetic material 140. The third through hole 134 extends from an upper surface 152 of the dielectric layer 150 through the magnetic material 140 and through the lower surface 154. The third through hole 134 is formed perpendicular, near perpendicular or askew to the longitudinal direction of the resin core 110. When the third through hole 134 is formed, an inner circumferential surface 144 of the magnetic material 140 is exposed. The diameter of the third through hole 134 is specified according to the desired application. The portion of the magnetic material 140 which protrudes or extends relative to the resin core 110 remains covered with the dielectric layer 150 after the third through hole 134 is formed.

A nickel layer 160 is disposed (deposited, formed, placed, coupled) on the exposed inner circumferential surface 144 of the magnetic material 140. An inner circumferential surface 162 of nickel (hereinafter, nickel will be interpreted broadly to include any passivation material) is formed (deposited, disposed, placed, coupled) within the third through hole 134. For example, the passivation material 160 is selectively formed on nearly all or all of the inner circumferential surface 144 of the magnetic material 140. The nickel layer 160 is any specified material which does not impede or react with the conductive material of the magnetic material 140. In an example, the nickel layer 160 is an electroless deposit. In an example, the nickel layer 160 is an electroless nickel.

Using the nickel layer 160 to cover the magnetic material 140 substantially prevents particles of the magnetic material 140 from, for example, leaching into a solution when the through hole 134 is cleaned. In another example, using the nickel layer 160 protects the magnetic material 140 from subsequent chemistries which occur from other materials placed near the magnetic material 140.

A second copper layer 122 is disposed (deposited, formed, placed, coupled) on the exposed surfaces upper surface 152 and lower surface 154 of the dielectric layer 150. In an example, the second copper layer 122 is at least one of eless copper or elytic copper. In an example, the second copper layer 122 is also disposed (deposited, formed, placed, coupled) on the inner circumferential surface 162 of the nickel layer 160. The second copper layer 122 plated on the inner circumferential surface 162 of the nickel layer 160 forms an inner circumferential surface of copper 124 within the third through hole 134. In an example, the second copper layer 122 is disposed (deposited, formed, placed, coupled) on substantially all exposed surfaces of the substrate 100. The second copper layer 122, in another example is disposed on specified locations or areas of the substrate 100 according to the desired purpose.

The dielectric layer 150 in combination with the nickel layer 160 separates the second copper layer 122 from the magnetic material 140. The separation of the second copper layer 122 from the magnetic material 140 substantially prevents the magnetic material 140 from interacting with the second copper layer 122.

The third through hole 134 (pathway) with an inner circumferential surface of copper 124 is plugged, or filled, with a filler 142 specified for the desired purpose. For example, the filler 142 is at least one of a polymer resin or dielectric material. The exposed surfaces of the substrate 100 are ground, etched or otherwise treated to form a smooth (e.g. nearly or completely flat, even, level) surface. A lid plate 146 is disposed on the outer surfaces of the filler 142. In an example, the lid plate 146 is a copper material. The second copper layer 122 is removed, or etched, from specified regions of the substrate 100. The second copper layer 122, in some examples, remains as a lid or cover. In an example, the remaining second copper layer 122 remains least partially over the upper surface 152 and lower surface 154 of the dielectric layer 150.

The example finished substrate 100, includes, for example, a resin core 110 with the dielectric layer 150 on the upper surface 113 and the lower surface 115. The substrate 100 has at least one first through hole 130 (pathway) filled (partially filled or completely filled) with magnetic material 140. The magnetic material 140 is formed with a third through hole 134 (pathway) extending through. A nickel layer 160 is on the inner circumferential surface 144 of the magnetic material 140. At least one second through hole 132 (pathway) is at a specified location on the substrate 100, either remote or proximate to the area containing the magnetic material 140. In an example, each of the second through holes 132 and third through holes 134 contain filler 142. In another example, the second through hole 132 and third through hole 134 optionally contain a filler 142. A copper layer 122 is disposed, for example, at least as a cap on the upper surface 152 and lower surface 154 of the dielectric layer 150 for the second through hole 132 and filler 142. The copper layer 122 can also extend a specified distance on the upper surface 152 and the lower surface 154 of the dielectric layer 150.

Figure 2:
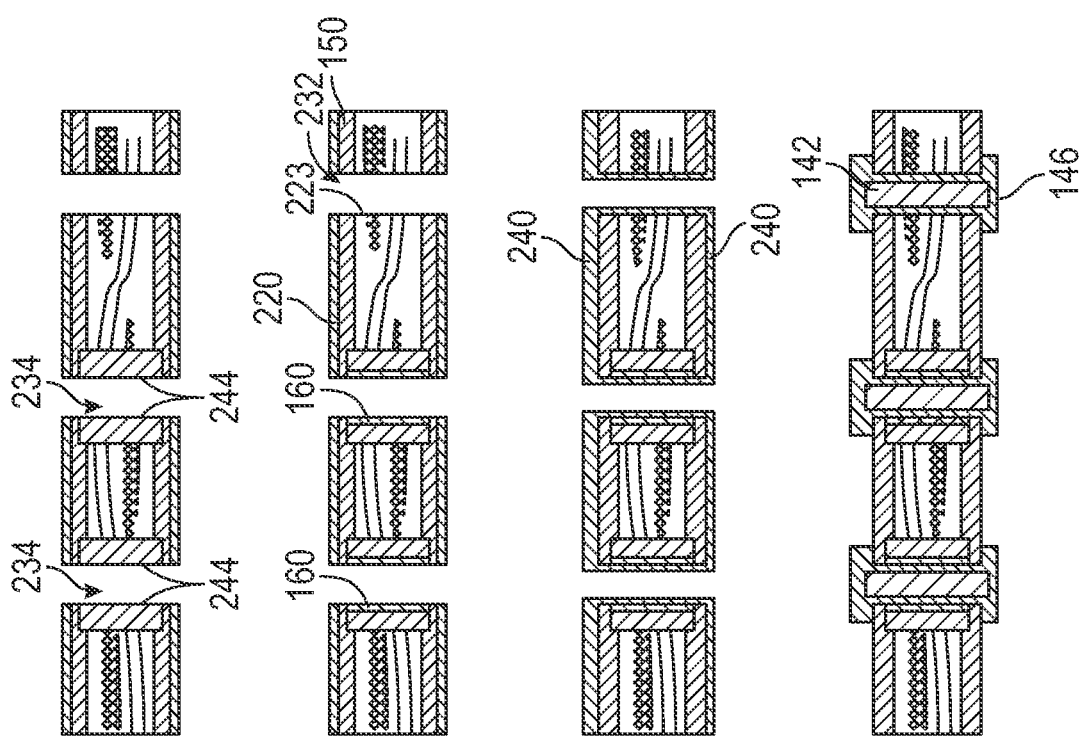
FIG. 2 is an illustration of a process flow for forming a substrate for a coaxial magnetic inductor loop.
Figure 2:
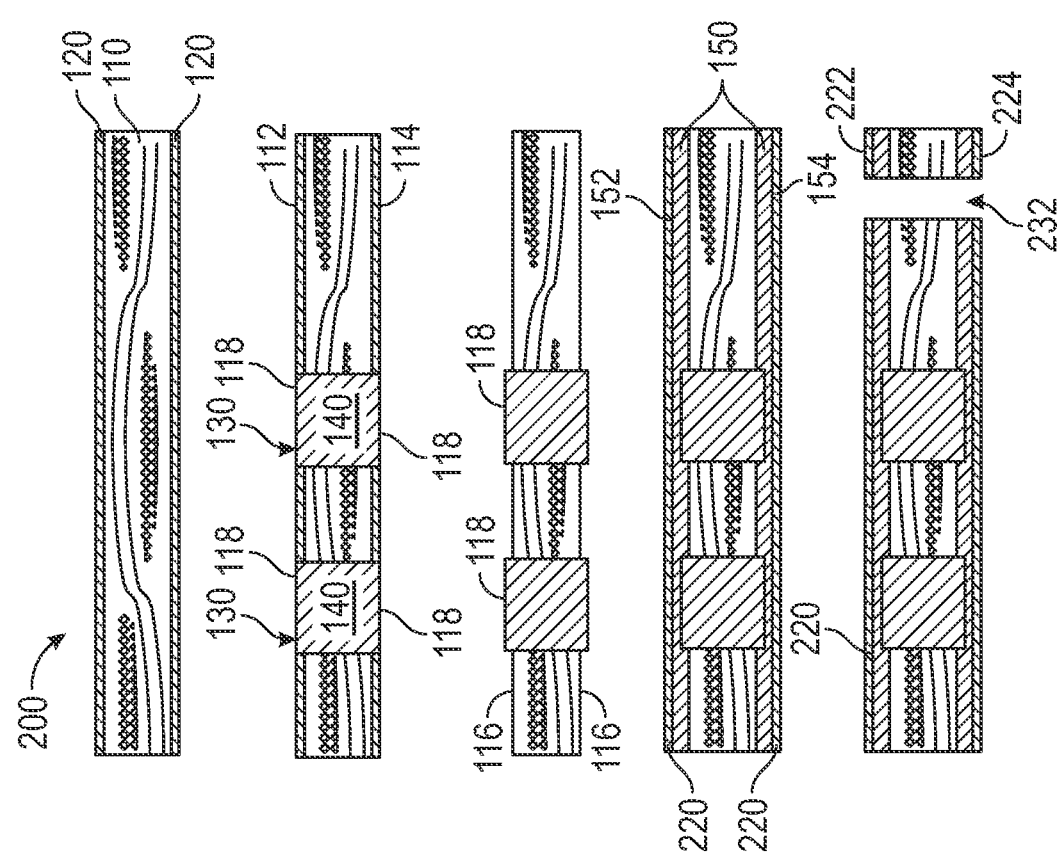

FIG. 2 illustrates a second example of a process flow for forming a semiconductor substrate 200. The some of the elements in FIG. 2 are similar to the elements and reference numbers in FIG. 1, as applicable. In the example illustrated in FIG. 2, a semiconductor substrate 200 has a resin core 110 with a copper layer 120 disposed (formed, placed, coupled) on at least one of the exposed surfaces 116 of the resin core 110. In an example, the copper layer 120 is a copper foil. The copper layer is referred to generically for any conductive material specified for the purpose of the substrate 200.

At least one first through hole 130 extends within the semiconductor substrate 200. Similar to FIG. 1. "through hole" will refer to a pathway through the associated materials. In an example, multiple first through holes 130 (first through hole will refer to both multiple and singular through holes) extend through the substrate 200. The at least one first through hole 130 extends from the upper surface 112 of the copper layer 120, passing through the resin core 110 and through the lower surface 114 of the copper layer 120. In an example, the first through hole 130 is formed perpendicular, near perpendicular or askew to the longitudinal direction of the resin core 110. The first through hole 130 is formed in a specified diameter according to the use of the substrate 200.

The first through hole 130, in an example, is filled (substantially filled, partially filled or completely filled) with a magnetic material 140. For example, the magnetic material 140 fills the first through hole 130 from the upper surface 112 to the lower surface 114 of the copper layer 120. The magnetic material 140, in another example, is a plug within the first through hole 130. The magnetic material 140 is any known material with magnetic properties. In an example, the magnetic material 140 is iron, iron alloys, nickel-zinc alloy, permalloy, silicon steels, ferrites, or amorphous alloys. In an example, the magnetic material 140 is an iron alloy such as ferrite or a ferrite with polymer resin.

After the magnetic material 140 fills the first through hole 130, the upper surface 112 and lower surface 114 of copper layer 120 are ground, filed or any similar process to make the upper surface 112 and lower surface 114 of the copper layer smooth (e.g. nearly or completely flat, even, level). In an example, both the copper layer 120 and the exposed surfaces 118 of magnetic material 140 are ground, filed or any similar process to make a smooth (e.g. nearly or completely flat, even, level) upper surface 112 and lower surface 114. In an example, at least one of the exposed surface 118 of the magnetic material 140 within the first through hole 130 is a smooth (e.g. nearly or completely flat, even or level) surface with the copper layer 120. In an example, the magnetic material extends, protrudes, or is exposed out of the first through hole 130 a substantially equal distance outside of the first through hole 130 as the copper layer 120 is thick.

As illustrated in FIG. 2, after the magnetic material 140 is filled within the first through hole 130 the copper layer 120 is etched or removed from the surface of the resin core 110 at specified (e.g. select locations, the whole surface) locations. The exposed surfaces 116 of the resin core 110, in some examples, may be ground, filed or any similar process or otherwise treated to make a smooth (e.g. nearly or completely flat, even, level) surface. In another example, no further action is taken to the exposed surfaces 116 to smooth or otherwise treat the exposed surfaces 116. When the copper layer 120 is etched from the resin core 110, the magnetic material 140 is exposed outside of the resin core 110. In an example, the magnetic material 140 is exposed, protrudes, or extends outside of the first through hole 130 the same or similar distance as the copper layer 120 was thick. In another example, the magnetic material 140 is exposed, protrudes, or extends outside of the first through hole 130 a distance less than the copper layer 120 was thick.

In the example illustrated in FIG. 2, a dielectric layer 150 is disposed (deposited, formed, placed, coupled) on the exposed surfaces 116 of the resin core 110 and the exposed surfaces 118 of the magnetic material 140. In an example, the dielectric layer 150 is a spacer between at least two materials layered above and below the dielectric layer. The dielectric layer 150 is, for example, a flat (nearly or completely) surface of at least one of an upper surface 152 and lower surface 154 on the substrate 200. In an example, the dielectric layer 150 covers the specified areas near or around the magnetic material 140.

In the example process flow of FIG. 2, a second copper layer 220 is disposed (deposited, formed, placed, coupled) on the exposed surface upper 152 and exposed lower surface 154 of the dielectric layer 150. The second copper layer 220 is disposed, in an example, to at least partially cover specified areas of the upper surface 152 and the lower surface 154 of the dielectric layer 150. In another example, the second copper layer 220 nearly completely covers the upper surface 152 and nearly completely covers the lower surface 154 of the dielectric layer 150.

In the example process flow illustrated in FIG. 2, at least one second through hole 232 (pathway) extends through the substrate 200. In an example, the second through hole 232 is a core through hole. In an example, the second through hole 232 extends from the upper surface 222 of the second copper layer 220, through the dielectric layer 150, the resin core 110 and through the lower surface 224 of the second copper layer 220. The second through hole 232 is formed perpendicular, near perpendicular or askew to the longitudinal direction of the resin core 110. In an example, the second through hole 232 is remote from the areas containing magnetic material 140. In another example, the second through hole 232 is proximate to the areas containing magnetic material 140. In an example, the second through hole 232 is a core through hole.

At least one third through hole 234 (pathway) extends through the areas containing magnetic material 140. The at least one third through hole 234 extends through the area containing magnetic material 140 from the upper surface 222 of the copper layer, through the dielectric layer 150, through the magnetic material 140, through the lower surface 154 of the dielectric layer 150, and through the lower surface 224 of the second copper layer 220. In an example, the at least one third through hole 234 is formed in the center of the magnetic material 140. In another example the at least one third through hole 234 is formed off center within the magnetic material 140. The third through hole 234 is formed perpendicular, near perpendicular or askew to the longitudinal direction of the resin core 110. The diameter of the third through hole 234 is specified by the use of the third through hole 234.

A nickel layer 160 (also referred to as passivation layer) is deposited on the inner circumferential surface 244 of the magnetic material 140. In an example, the nickel layer 160 is deposited on the magnetic material 140. The dielectric layer 150, for example, acts as a barrier (or spacer) between the magnetic material 140, the nickel layer 160 and the second copper layer 220. In an example, the nickel layer 160 is minimally deposited on the dielectric layer 150, while still maintaining a space between the termination of the nickel layer 160 and the second copper layer 220.

A third copper layer 240 is disposed (deposited, formed, placed, coupled) on the second copper layer 220. In an example, the third copper layer 240 is disposed (deposited, formed, placed, coupled) on the upper surface 222 of the second copper layer 220, the inner circumferential surface 223 of the at least one third through hole 234 and the lower surface 224 of the second copper layer 220.

Similar to the process flow of FIG. 1, the third through hole 234 and the second through hole 232 are plugged, or filled, with a filler 142 specified for the desired purpose. For example, the filler 142 is at least one of a polymer resin or dielectric material. The substrate 200 is cured. The second copper layer 220 and the third copper layer 240 are then etched, ground, filed, or otherwise removed from the upper surface 152 and lower surface 154 of the dielectric layer 150 at specified locations. A lid plate 146 is disposed on the outer surfaces of the filler 142. In an example, the lid plate 146 is a copper material similar to that of at least one of the second copper layer 220 or third copper layer 240.

The example finished substrate 200 includes, for example, a resin core 110 with a dielectric layer 150 on the upper surface 113 and lower surface 115 of the resin core 110. A second copper layer 220 and a third copper layer 240 disposed on the upper surface 152 and the lower surface 154 of the dielectric layer 150. The substrate 200 further includes, for example, at least one first through hole filled with magnetic material 140. The magnetic material 140 has a third through hole 234 (pathway) extends within it and a nickel layer 160 layered or deposited on the inner circumferential surface 244 of the magnetic material. The substrate 200 has at least one second through hole 232 (pathway) at a specified location in the substrate either remote or proximate to the magnetic material 140. At least one second copper layer 220 surrounds or is proximate to the second through hole 232 and third through hole 234. At least one of the second through hole 232 and third through hole 234 are filled with a filler 142. The filler 142 is optionally capped with a layer of copper at least substantially continuous with the copper surround the second and third through holes. 232 and 234 respectively.

Figure 3:
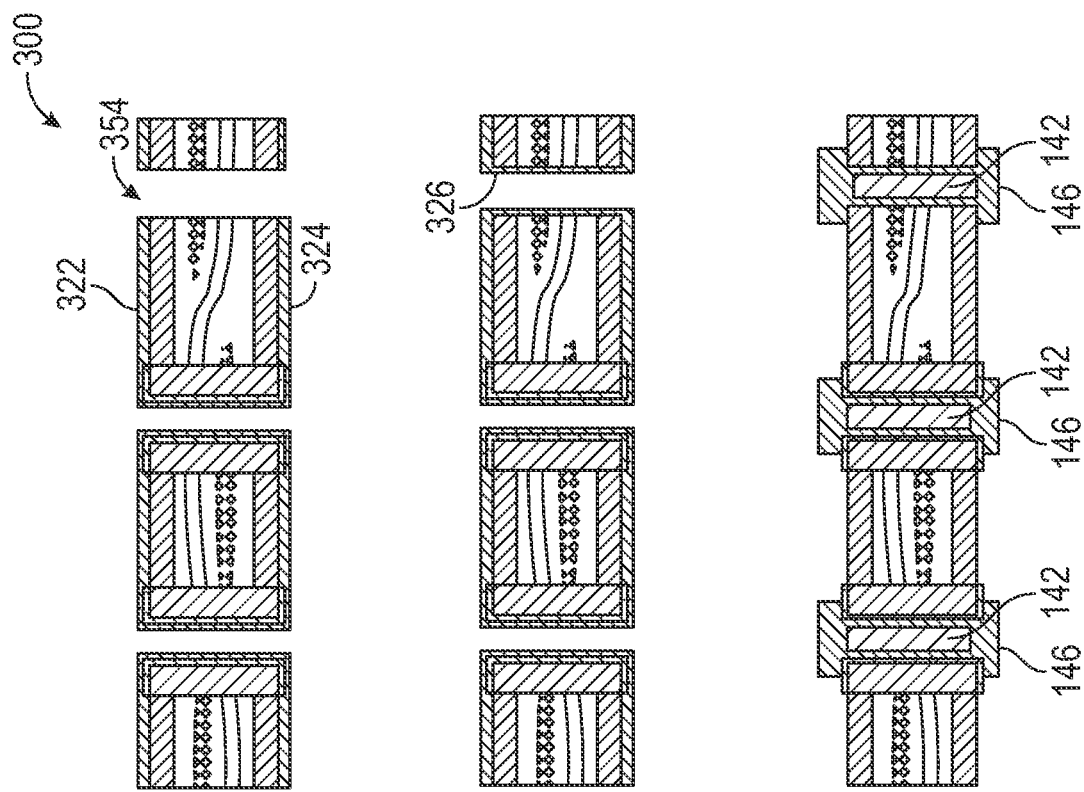
FIG. 3 is an illustration of a process flow for forming a substrate for a coaxial magnetic inductor loop.
Figure 3:
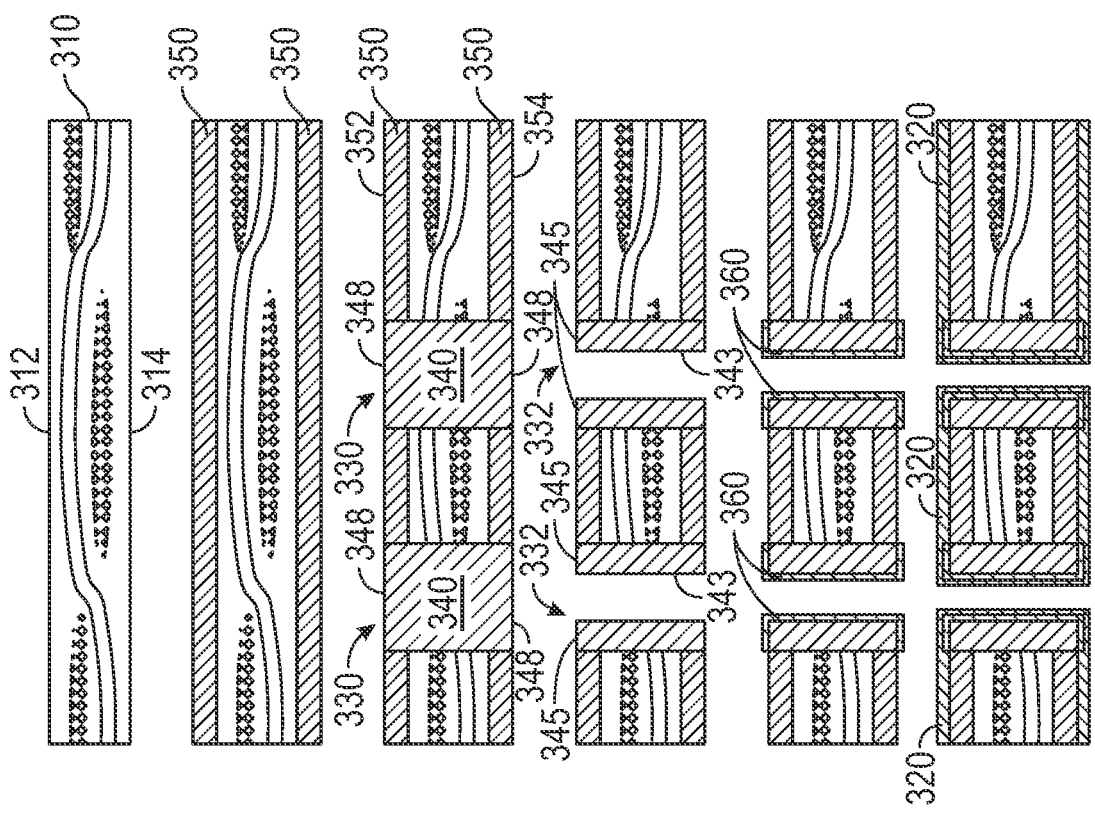

FIG. 3 illustrates a third example process flow for forming a semiconductor substrate 300. In this third example of a process flow, and resulting substrate 300, a resin core 310 is provided similar to the resin core described in relationship to FIG. 1. In the example shown in FIG. 3, the resin core 310 is provided without a copper layer, or any other material, on either the upper surface 312 or lower surface 314. A dielectric layer 350 is disposed (deposited, formed, placed, coupled) on, for example, the upper surface 312 and lower surface 314 of the resin core 310. In an example, the dielectric layer 350 is a spacer between at least two materials layered above and below the dielectric layer. The resin core 310 and dielectric layer 350 are, in an example, similar materials to those described for FIGS. 1 and 2.

At least one first through hole 330 (pathway) extends within the substrate 300. Hereinafter. "through hole" will refer to a pathway through the associated materials. In an example, the at least one first through hole 330 extends from the upper surface 352 of the dielectric layer 350, through the resin core 310 and through the lower surface 354 of the dielectric layer 350. The at least one first through hole 330 is formed with a specified diameter according to its use. In an example the first through hole 330 is formed perpendicular, near perpendicular or askew to the longitudinal direction of the resin core 310.

The at least one first through hole 330 is filled (fully filled or partially filled) with a magnetic material 340 similar to the magnetic material of the process flow illustrated in FIG. 1. The magnetic material 340 is filled, for example, to extend from the lower surface 354 to the upper surface 352 of the dielectric layer. In an example, at least one of the upper surface 352 and lower surface 354 of the dielectric layer 350 is smooth (e.g. nearly or completely flat, even, level) with the exposed surfaces 348 of the magnetic material 340. In another example, the at least one of the upper surface 352 and lower surface 354 of the dielectric layer 350 is nearly smooth (e.g. rough, uneven) with the exposed surfaces 348 of the magnetic material 340.

A second through hole 332 (pathway) extends within the magnetic material 340. In an example, the second through hole 332 is an electrical pathway. In an example, a second through hole 332 extends within each of the at least one areas of magnetic material 340. The second magnetic through hole 332 is formed, for example, in the center of the area of magnetic material 340. In another example, the second through hole 332 is formed off center of the area of magnetic material 340. In an example the second through hole 332 is formed perpendicular, near perpendicular or askew to the longitudinal direction of the resin core 310.

In the example substrate 300, and process flow, illustrated in FIG. 3, a nickel layer (passivation layer) 360 is disposed (deposited, formed, placed, coupled) on the inner circumferential surface 343 of the second through hole 332. The nickel layer 360, illustrated in FIG. 3, is similar to the nickel layer used in reference to FIG. 1. In an example, the nickel layer 360 is disposed (deposited, formed, placed, coupled) on the inner circumferential surface 343 of the second through hole 332 in a manner in which it extends beyond the upper surface 352 and lower surface 354 of the dielectric layer 350. In an example, the nickel layer 360 is disposed (deposited, formed, placed, coupled) on the exposed surfaces 345 of the magnetic material 340 at least one of the upper surface 352 or lower surface 354 of the dielectric layer 350 thereby, forming the nickel layer 360 on the exposed surfaces 345 of the magnetic material.

A copper layer 320 is disposed (deposited, formed, placed, coupled) to at least partially cover the upper surface 352 of the dielectric layer 350 and the lower surface 354 of the dielectric layer 350. In an example, the copper layer 320 covers the exposed surfaces of the nickel layer 360. For example, the copper layer 320 at least partially covers the nickel layer 360 within the second through hole 332 and the nickel layer 360, for example, on the exposed surfaces 345 of the magnetic material 340 outside of the second through hole 332. In the example shown in FIG. 3, the magnetic material 340 is protected from interacting with the copper layer 320 by at least one of the dielectric layer 350 and the nickel layer 360.

At least one third through hole (pathway) 334 extends, in one example, remote from the areas of the substrate 300 containing magnetic material 340. In another example the third through hole 334 is formed proximate to the areas of the substrate 300 containing magnetic material 340. In an example, the third through hole 334 is a core through hole. In another example, the third through hole is an electrical pathway. The third through hole 334 for example, extend from the upper surface 322 of the copper layer 320, through the dielectric layer 350, the resin core 310 and extends through lower surface 324 of the copper layer 320. In an example the third through hole 330 is formed perpendicular, near perpendicular or askew to the longitudinal direction of the resin core 310.

In an example, a layer of copper 326 is deposited within the core through hole 370.

Similar to the process flow of FIG. 1, at least one of the second through hole 332 and the third through hole 334 are plugged, or filled, with a filler 142 specified for the desired purpose. For example, the filler 142 is at least one of a polymer resin or dielectric material. The substrate 300 is cured. The copper layer 320 is then etched, ground, filed or removed in a similar method. The copper layer 320, in an example, remains in specified locations on the substrate according to the purpose. A lid plate 146 is disposed on the outer surfaces of the filler 142. In an example, the lid plate 146 is a copper material.

The example substrate 300 includes, for example, the resin core 310 with the dielectric layer 350 disposed (deposited, formed, placed, coupled) on the upper surface 312 and lower surface 314 of the resin core 310. A magnetic material 340, for example, extends within at least one first through hole from the lower surface 524 to the upper surface 352 of the dielectric layer 350. The exposed surfaces 345 of the magnetic material are, for example, smooth (e.g. nearly or completely flat, even, level) with the dielectric layer 350. A second through hole 332 (pathway) extends within the magnetic material 340. The second through hole 332 forms, for example, an inner circumferential surface 343 within the magnetic material 340. A nickel layer 360 is disposed (deposited, formed, placed, coupled) on at least the inner circumferential surface 343 of the magnetic material 340. The nickel layer 360, in an example, is also deposited disposed (deposited, formed, placed, coupled) on the exposed surfaces 345 of the magnetic material 340. A copper layer 320 is disposed at specified locations on at least on the upper surface 352 and lower surface 354 of the dielectric layer 350. In an example, the copper layer 320 is disposed on the nickel layer 360 on the exposed surfaces 345 of the magnetic material 340 outside of the second through hole 332. A third through hole 334 (pathway), for example, extends from the upper surface 322 of the copper layer 320, through the dielectric layer 350, through the core 310, through the lower surface 354 of the dielectric layer 350, and through the lower surface 324 of the copper layer 320. The substrate 300 also includes, by example, a filler 142 within the least one of the second through hole 332 and third through hole 334. A lid plate 146 caps or covers the filler 142. In an example, the lid plate 146 is a copper cap.

Figure 4:
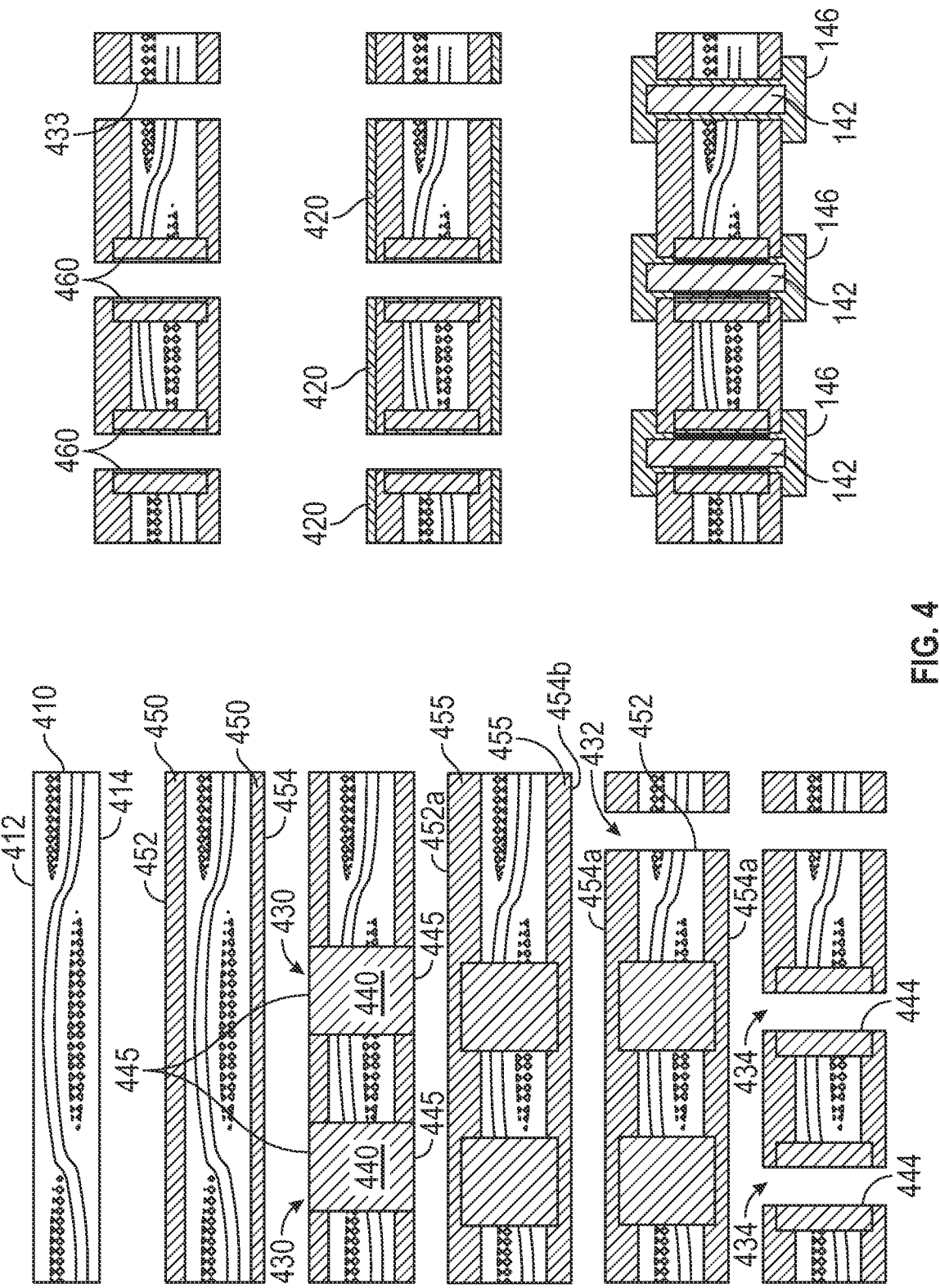
FIG. 4 is an illustration of a process flow for forming a substrate for a coaxial magnetic inductor loop.

FIG. 4 is an example of a fourth process flow and resulting substrate 400. In the example of FIG. 4, a resin core 410 is provided with a dielectric layer 450 disposed (deposited, formed, placed, coupled) on the upper surface 412 and lower surface 414 of the resin core 410. In an example, the dielectric layer 450 is a spacer between at least two materials layered above and below the dielectric layer. The resin core 410 and the dielectric layer 450 are similar substances as discussed previously related to each of the previous Figures.

As illustrated in FIG. 4, at least one first through hole 430 (pathway) extends within the substrate 400. In an example, multiple first through holes 430 (through hole will refer to both multiple and singular through holes) extend within the substrate 400. The at least one first through hole 430 extends, for example, from an upper surface 422 of the dielectric layer 450 through the resin core 410 and through the lower surface 454 of the dielectric layer 450. In an example, the first through hole 430 is formed perpendicular, near perpendicular or askew to the longitudinal direction of the resin core 410. The first through hole 430 is formed in a specified diameter according to the use of the substrate.

The at least one first through hole 430 is filled (fully filled or partially filled) with a magnetic material 440 similar to the magnetic material of the process flow and resulting substrate as described in the previous Figures. The magnetic material 440 is filled to extend from the upper surface 452 of the dielectric layer to the lower surface 454 of the dielectric layer 450. In an example, at least one of the upper surface 452 and lower surface 454 of the dielectric layer 450 is smooth (e.g. nearly or completely flat, even, level) with the exposed surfaces 445 of the magnetic material 440. In another example, the least one of the upper surface 452 and lower surface 454 of the dielectric layer 450 is nearly smooth (e.g. rough, uneven) with the exposed surfaces 445 of the magnetic material 440.

A second dielectric layer 455 is disposed (deposited, formed, placed, coupled) on the upper surface 452 of the first dielectric layer 450 and the lower surface 454 of the first dielectric layer 450. The second dielectric layer 455 at least partially covers the exposed surfaces 445 of the magnetic material 440. The thickness of the second layer 455 is specified according to the purpose. At least one of the upper surface 452*a* and lower surface 454*b* of the second dielectric layer 455, in an example, are smooth (e.g. nearly or completely flat, even, level). In another example, the least one of the upper surface 452*a* and lower surface 454*b* of the second dielectric layer 455 is nearly smooth (e.g. rough, uneven).

At least one second through hole 432 (pathway) extends within the substrate 400. In an example, second through hole 432 is a core through hole. In an example, the second through hole is an electrical pathway. In an example, the second through hole 432 is disposed proximate to the areas containing the magnetic material 440. The second through hole 432, in another example, is placed a specified distance away from the magnetic material 440 according to the purpose of the substrate 400. The second through hole 432 extends from the upper surface 452*a* of the second layer 455 of the dielectric layer spacer layer 450, through the resin core 410 and through the lower surface 454*b* of the second dielectric layer 455. In an example, the second through hole 432 is formed perpendicular, near perpendicular or askew to the longitudinal direction of the resin core 410. The second through hole 432 is formed in a specified diameter according to the use of the substrate.

At least one third through hole 434 (pathway) extends within the magnetic material 440. In an example, the third through hole 434 is a coaxial through hole. In an example the third through hole 434 is an electrical pathway. The third through hole 434 is formed, for example, in the center of the magnetic material 440. In another example, the third through hole 434 is formed off center of the magnetic material 440. The third through hole 434 extends from the upper surface 452a of the second layer of dielectric layer 455 through the magnetic material 440 and through the lower surface 454b of the second layer of dielectric layer 455. In an example, the third through hole 432 is formed perpendicular, near perpendicular or askew to the longitudinal direction of the resin core 410. The third through hole 434 is formed in a specified diameter according to the use of the substrate.

In an example, a nickel layer 460 is formed (deposited, extends, placed, coupled) on the inner circumferential surface 444 of the magnetic material 440. The nickel layer 460 disposed (deposited, extends, placed, coupled) on the inner circumferential surface 444 of the magnetic material 440 is similar to the nickel layer described for FIG. 1.

As illustrated in FIG. 4, a copper layer 420 is disposed (deposited, extends, placed, coupled) for example, at least on one of the upper surface 452a and lower surface 454b of the second layer of dielectric layer 455, the nickel layer 460 and the inner surface 433 of the second through hole 432.

Similar to the process flow of FIG. 1, the third through hole 434 and the second through hole 432 are plugged, or filled, with a filler 142 specified for the desired purpose. For example, the filler 142 is at least one of a polymer resin or dielectric material. The exposed copper layer 420 are etched, filed, ground or any similar process. The copper layer 420 remains, in some examples, at specified locations on the substrate, and a lid plate 146 is disposed on the outer surfaces of the filler 142. In an example, a lid plate 146 is a copper material.

The example substrate 400 includes a resin core 410 with a dielectric layer 450 deposited on the upper surface 412 and the lower surface 414 of the resin core 410. The substrate 400 has at least one first through hole 430 which extends from an upper surface 452 of the dielectric layer 450 through the core and through the lower surface 454b of the dielectric layer 450. A magnetic material 440 fills the at least one first through hole 430 such that the magnetic material 440 and dielectric layer 450 form, in one example, a nearly smooth surface. The substrate 400 has a second dielectric layer 455 disposed on the upper surface 452 and lower surface 454b of the dielectric layer 450 and covers, for example the exposed surfaces 445 of the magnetic material 440. The substrate 400 has at least one second through hole 432 (pathway) at a position specified by the purpose of the substrate 400. In an example, the second through hole 432 is proximate to the areas containing the magnetic material 440. In another example, the second through hole 432 is remote from the magnetic material 440. The substrate 400 has a third through hole (pathway) 434 extending from the upper surface 452a through both the first and second dielectric layers 450 and 455, respectively, through the magnetic material 440 and through the lower two layers of the first and second dielectric layer 450 and 455. At least one of the second through hole 432 and third through hole 434 has a filler 142 disposed within it. In an example, a lid plate 146 covers the filler 142.

Each of the above examples are examples of a substrate which is a component part of a semiconductor device. The substrates discussed above are, in an example, coupled to a semiconductor chip.

In each of the above examples, there are both through holes extend within magnetic material and through holes which are non-magnetic. This combination of through holes are, in some examples, components of a magnetic loop. In another example, this combination of through holes are components of an inductor. In another example, the components of the substrate, such as the through holes, both magnetic and non-magnetic, are part of a voltage regulator circuit which is imbedded within the substrate. In each of the above examples, the through holes are, for example, electrical pathways.

Figure 5:
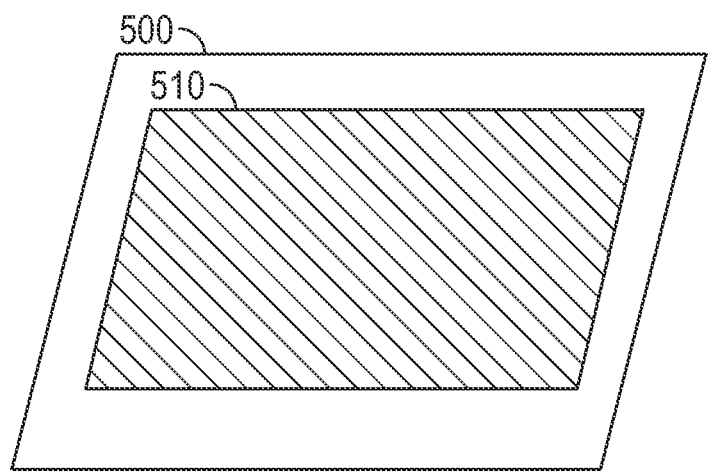
FIG. 5 illustrates a substrate with a chip coupled with the substrate.

FIG. 5 illustrates a substrate 500 with a chip 510 coupled with the substrate 500. The substrate 500 is, for example, any of the above-described substrates which act as the supporting material upon which elements of a semiconductor device are coupled.

Figure 6:
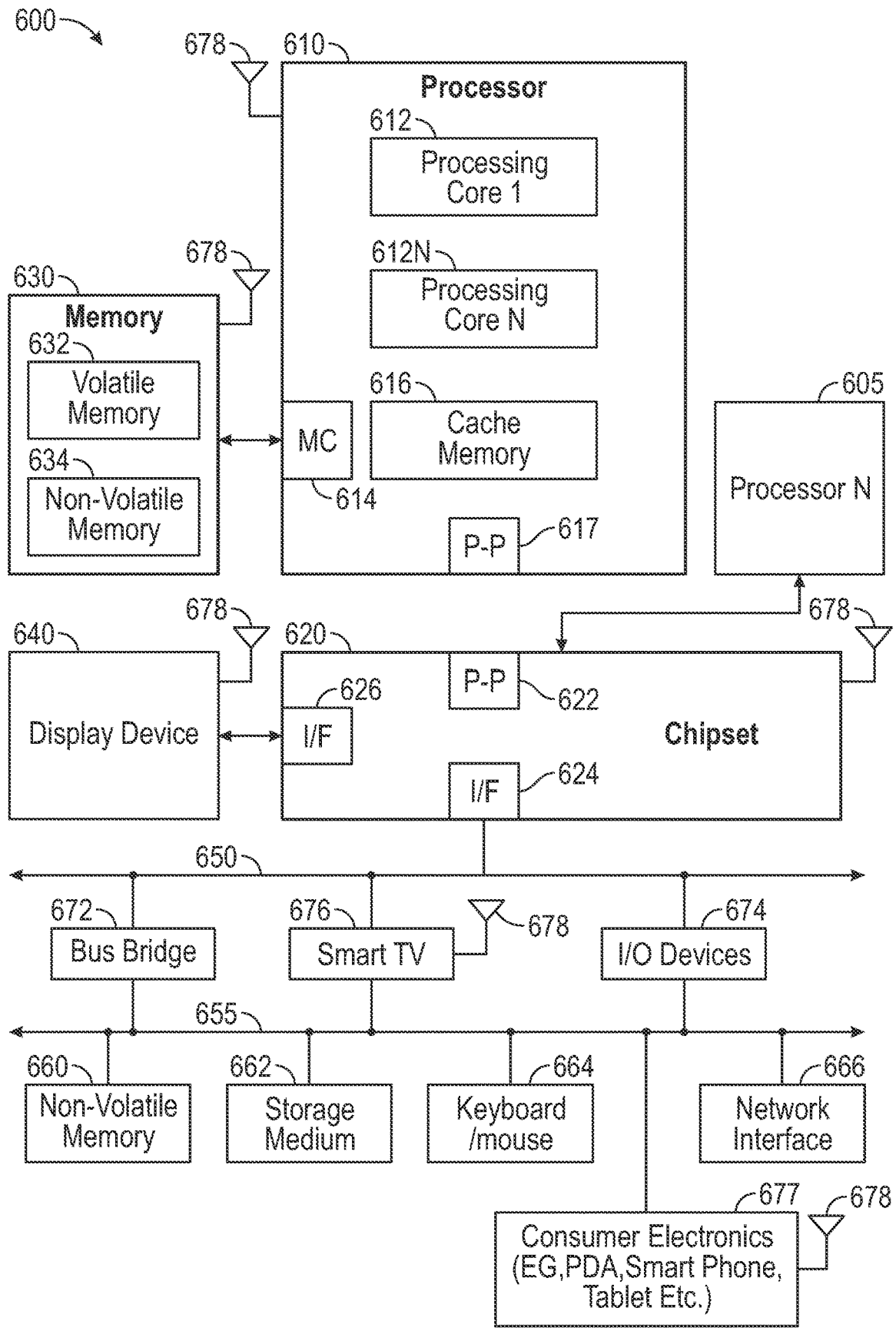
FIG. 6 illustrates a system level diagram, depicting an example of an electronic device (e.g., system) including a substrate containing a magnetic inductor device.

FIG. 6 illustrates a system level diagram, depicting an example of an electronic device (e.g., system) that may include a substrate containing a magnetic inductor device and which is formed, for example, from any of the example process flows described above. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 includes a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family. Home Plug AV (HPAV), Ultra Wide Band (UWB), Bluetooth. WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals. In one example, any combination of components in a chipset may be separated by a continuous flexible shield as described in the present disclosure.

Chipset 620 connects to display device 640 via interface 626. Display 640 may be, for example, a liquid crystal display (LCD), a light emitting diode (LED) array, an organic light emitting diode (OLED) array, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family. Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

Various Notes and Aspects

Aspect 1 can include a semiconductor substrate which includes a core, dielectric layer and at least one electrical transmission pathway. The electrical transmission pathway extends through, at least, the dielectric layer and the core. The pathway has a magnetic material with a second electrical transmission pathway extending within. A nickel layer is then deposited within the second pathway. A copper layer is disposed on the nickel layer. The nickel layer and dielectric spacer separate the copper layer from the magnetic material.

Aspect 2 can include, or can optionally be combined with the subject matter of Aspect 1, to optionally include the first and second pathways are components of an inductor.

Aspect 3 can include, or can optionally be combined with the subject matter of Aspect 1, to optionally include the first and second pathways as components of a magnetic inductor loop.

Aspect 4 can include, or optionally be combined with the subject matter of Aspect 1, to optionally include the dielectric layer being one of a polymer, polymer resin, rubber, glass, inorganic nitride passivation, or metal oxide.

Aspect 5 can include, or can optionally be combined with the subject matter of Aspect 1, to optionally include the nickel layer being electroless nickel.

Aspect 6 can include, or can optionally be combined with the subject matter of Aspect 1, to optionally include the magnetic material is at least one of iron, iron alloys, nickel-zinc alloy, permalloy, silicon steels, ferrites, or amorphous alloys.

Aspect 7 can include, or optionally be combined with the subject matter of Aspect 1, to optionally include the nickel layer being on the magnetic material outside of the pathway.

Aspect 8 can include or optionally, be combined with the subject matter of Aspect 1, to optionally include the magnetic material being within the pathway on the core layer and the dielectric layer.

Aspect 9 can include or optionally, be combined with the subject matter of Aspect 1, to optionally include the nickel layer deposited on the magnetic material extending from an upper surface of the semiconductor substrate to a lower surface of the semiconductor substrate.

Aspect 10 can include or optionally, be combined with the subject matter of Aspect 1, to optionally include the nickel layer deposited within the pathway and on an upper surface and a lower surface of the semiconductor substrate proximate to the pathway.

Aspect 11 can include or optionally, be combined with the subject matter of Aspect 1, to optionally include the copper layer disposed within the second pathway and on the upper and lower surface of the semiconductor substrate.

Aspect 12 can include or optionally, be combined with the subject matter of Aspect 1, to optionally include the copper layer disposed on the dielectric layer and on the nickel layer within the pathway.

Aspect 13 can include a semiconductor device with a semiconductor chip coupled to a package substrate and a voltage regulator circuit at least partially imbedded within the package substrate. The voltage regulator circuit includes an electrical transmission pathway with a core, a dielectric layer fixed on a lower and an upper surfaces of the core, and at least one electrical transmission pathway in the core. The electrical transmission though hole has magnetic material disposed on an inner circumferential surface of the at least one pathway, a nickel layer deposited on an inner circumferential surface of the magnetic material at least within the pathway; and a copper layer disposed on the nickel layer. The dielectric spacer separates the copper layer from the magnetic material.

Aspect 14 can include or optionally, be combined with the subject matter of Aspect 13, to optionally include the dielectric layer is at least one of a polymer, polymer resin, rubber, glass, inorganic nitride passivation, or metal oxide.

Aspect 15 can include or optionally, be combined with the subject matter of Aspect 13, to optionally include the nickel layer is electroless nickel.

Aspect 16 can include or optionally, be combined with the subject matter of Aspect 13, to optionally include the magnetic material is a filler selected from at least one of iron, iron alloys, nickel-zinc alloy, permalloy, silicon, steels, ferrites, or amorphous alloys.

Aspect 17 can include or optionally, be combined with the subject matter of Aspect 13, to optionally include the pathway is a component of an inductor.

Aspect 18 can include or optionally, be combined with the subject matter of Aspect 13, to optionally include the nickel layer extending outside of the pathway and on an upper and a lower surface of the electrical transmission pathway.

Aspect 19 can include or optionally, be combined with the subject matter of Aspect 13, to optionally include the copper layer disposed on an upper and a lower surface of the electrical transmission pathway.

Aspect 20 can include a method of forming a semiconductor substrate by forming at least one first pathway through a core having and upper and lower surface. Filling the pathway with a magnetic material. Forming a dielectric layer on the upper and lower surface of the core. Forming at least one second pathway through the dielectric spacer and the magnetic filler. Coating at least the inner circumferential surface of the magnetic material within pathway with a nickel layer. Plating a layer of copper on the exposed layers of at least one of the nickel layer and the dielectric layer.

Aspect 21 can include or optionally, be combined with the subject matter of Aspect 20, to optionally include forming a copper layer on the core before forming the first pathway.

Aspect 22 can include or optionally, be combined with the subject matter of Aspect 20, to optionally include etching the copper layer off of at least one of the core after forming the at least one first pathway and filling the pathway with magnetic material.

Aspect 23 can include or optionally, be combined with the subject matter of Aspect 20, to optionally include fixing the dialectic layer to the upper and lower surfaces of the core before forming the first pathway.

Aspect 24 can include or optionally, be combined with the subject matter of Aspect 20, to optionally include coating the nickel layer to extend onto exposed surfaces of the dielectric layer outside of the pathway.

Aspect 25 can include or optionally, be combined with the subject matter of Aspect 20, to optionally include the layer of copper is plated nearly continuously on the exposed surfaces of the nickel layer and the dielectric layer.

Aspect 26 can include or optionally, be combined with the subject matter of Aspect 20, to optionally include etching the layer of copper away from the exposed surfaces of the exposed dielectric layers remote from the pathway.

Aspect 27 can include or optionally, be combined with the subject matter of Aspect 20, to optionally include at least one second pathway is formed after the dielectric layer and the copper layer are formed on the core.

Each of these non-limiting aspects can stand on its own, or can be combined in various permutations or combinations with one or more of the other aspects.

The above description includes references to the accompanying drawings, which form a part of the detailed description. The drawings show, by way of illustration, specific embodiments in which the embodiments can be practiced. These embodiments are also referred to herein as "aspects" or "examples." Such aspects or example can include elements in addition to those shown or described. However, the present inventors also contemplate aspects or examples in which only those elements shown or described are provided. Moreover, the present inventors also contemplate aspects or examples using any combination or permutation of those elements shown or described (or one or more features thereof), either with respect to a particular aspects or examples (or one or more features thereof), or with respect to other Aspects (or one or more features thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B." "B but not A." and "A and B." unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first." "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The above description is intended to be illustrative, and not restrictive. For example, the above-described aspects or examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as aspects, examples or embodiments, with each claim standing on its own as a separate embodiment, and it is contemplated that such embodiments can be combined with each other in various combinations or permutations. The scope of the embodiments should be determined with reference to the appended claims, along with the full scope of equivalents to which such claims are entitled.

What is claimed is:

1. A semiconductor substrate comprising:
   a core;
   a dielectric layer fixed on the core;
   at least one first electrical transmission pathway extending through at least one of the dielectric layer and the core, including:
   a magnetic material disposed within the at least the core of the at least one first electrical transmission pathway;

at least one second electrical transmission pathway extending through the magnetic material;
a nickel layer disposed on inner circumferential surface of the magnetic material at least within the second electrical transmission pathway;
a copper layer disposed on at least the dielectric layer within the second electrical transmission pathway, wherein:
the dielectric layer or the nickel layer separates the copper layer from the magnetic material; and
at least one third pathway extending through at least one of the dielectric layer and the core separate from the at least one electrical transmission pathway.

2. The semiconductor substrate of claim 1 wherein the first electrical transmission pathway and second electrical transmission pathway are a component of an inductor.

3. The semiconductor substrate of claim 1 where in the first electrical transmission pathway and second electrical transmission pathway are a component of a magnetic inductor loop.

4. The semiconductor substrate of claim 1 wherein the dielectric layer is at least one of a polymer, polymer resin, rubber, glass, inorganic nitride passivation, or metal oxide.

5. The semiconductor substrate of claim 1 wherein the nickel layer includes electroless nickel.

6. The semiconductor substrate of claim 1 wherein the magnetic material is at least one of iron, iron alloys, nickel-zinc alloy, permalloy, silicon steels, ferrites, or amorphous alloys.

7. The semiconductor substrate of claim 1 wherein the nickel layer is on the magnetic material outside of the second electrical transmission pathway.

8. The semiconductor substrate of claim 1 wherein the magnetic material is disposed within the rust electrical transmission pathway extending through the dielectric layer and the core.

9. The semiconductor substrate of claim 1 wherein the nickel layer is on the magnetic material extending from an upper surface of the semiconductor substrate to a lower surface of the semiconductor substrate.

10. The semiconductor substrate of claim 9 wherein the nickel layer is disposed within the second electrical transmission pathway and on an upper surface and a lower surface of the semiconductor substrate proximate to the second electrical transmission pathway.

11. The semiconductor substrate of claim 1 wherein the copper layer is disposed within at least one of the second transmission pathway and third pathway and on an upper surface and a lower surface of the semiconductor substrate.

12. The semiconductor substrate of claim 1 wherein the copper layer is on the dielectric layer and on the nickel layer within the electrical transmission pathway.

13. A semiconductor device comprising:
a semiconductor chip coupled to a package substrate; and
a voltage regulator circuit at least partially imbedded within the package substrate, the voltage regulator circuit including:
an electrical transmission pathway including:
a core;
a dielectric layer on a lower and an upper surfaces of the core;
at least one first electrical transmission pathway in the core, including:
a magnetic material disposed on an inner circumferential surface of the at least one electrical transmission pathway;
at least one second electrical transmission pathway extending within the magnetic material;
a nickel layer disposed on an inner circumferential surface of the magnetic material at least within the second electrical transmission pathway;
a copper layer disposed on the nickel layer, wherein:
the dielectric spacer separates the copper layer from the magnetic material; and
at least one third pathway extending through at least one of the dielectric layer and the core separate from the at least one first electrical transmission pathway.

14. The semiconductor device of claim 13 wherein the dielectric layer is at least one of a polymer, polymer resin, rubber, glass, inorganic nitride passivation, or metal oxide.

15. The semiconductor device of claim 13 wherein the nickel layer is electroless nickel.

16. The semiconductor device of claim 13 wherein the magnetic material is a filler selected from at least one of iron, iron alloys, nickel-zinc alloy, permalloy, silicon, steels, ferrites, or amorphous alloys.

17. The semiconductor device of claim 13 wherein the first electrical transmission pathway is a component of an inductor.

18. The semiconductor device of claim 13 wherein the nickel layer extends outside of the second electrical transmission pathway and on an upper and a lower surface of the magnetic material.

19. The semiconductor device of claim 13 wherein the copper layer is disposed on an upper and a lower surface of the electrical transmission pathway.

20. A method of forming a semiconductor substrate comprising:
forming at least one first pathway through a core having and upper and lower surface;
filling the first pathway with a magnetic material;
disposing a dielectric layer on the upper and lower surface of the core;
forming at least one second pathway through the dielectric spacer and the magnetic material;
disposing a nickel layer on at least an inner circumferential surface of the magnetic material;
forming a third pathway separate from at least the first pathway or second pathway; and
disposing a copper layer on exposed layers of at least one of the nickel layer and the dielectric layer.

21. The method of claim 20 further comprising disposing a copper layer on the core before forming the first pathway.

22. The method of claim 21 further comprising removing the copper layer from at least portion of the core after forming the at least one first pathway and filling the second pathway with magnetic material.

23. The method of claim 20 further comprising disposing the dielectric layer on the upper and lower surfaces of the core before forming the first pathway.

24. The method of claim 23 further comprising coating the nickel layer to extend onto exposed surfaces of the dielectric layer outside of the second pathway.

25. The method of claim 24 wherein the copper layer is disposed continuously on the exposed surfaces of the nickel layer and the dielectric layer.

26. The method of claim 20 further comprising etching the copper layer away from an exposed surface of the dielectric layers remote from at least one of the first pathway and second pathway.

27. The method of claim 20 wherein the at least one second pathway is formed after the dielectric layer and the copper layer are formed on the core.

\* \* \* \* \*